United States Patent [19]

Fong

[11] Patent Number: 5,374,894

[45] Date of Patent: Dec. 20, 1994

[54] TRANSITION DETECTION CIRCUIT

[75] Inventor: Vincent L. Fong, Fremont, Calif.

[73] Assignee: Hyundai Electronics America, San Jose, Calif.

[21] Appl. No.: 932,433

[22] Filed: Aug. 19, 1992

[51] Int. Cl.[5] .............................................. H03K 5/22
[52] U.S. Cl. .................................. 327/14; 365/233.5; 327/1
[58] Field of Search ................. 307/231, 517, 518, 601, 307/234, 354; 328/104, 115, 117, 132, 114; 365/233.5

[56] References Cited

U.S. PATENT DOCUMENTS

| | | | |
|---|---|---|---|
| 4,591,744 | 5/1986 | Koike | 307/518 |
| 5,159,574 | 10/1992 | Kim et al. | 307/517 |
| 5,199,002 | 3/1993 | Ang et al. | 365/233.5 |
| 5,264,737 | 11/1993 | Oikawa | 365/233.5 |

FOREIGN PATENT DOCUMENTS 0053653  4/1977  Japan .................................. 307/231

OTHER PUBLICATIONS

"Address Transition Detection Enhancement Circuit", IBM Technical Disclosure Bulletin, vol. 30 No. 8, Jan 1988 pp. 63–64.

Primary Examiner—Timothy P. Callahan
Assistant Examiner—Toan Tran
Attorney, Agent, or Firm—Townsend and Townsend Khourie and Crew

[57] ABSTRACT

A circuit for detecting the transition of the state of logic signals at a plurality of input terminals is provided. The circuit has a transition detecting block connected to each input terminal which generates a pulse at the transition of a logic signal at the input terminal, an OR logic block connected to each transition detecting block for generating a combined logic signal from the transition detecting blocks, and a latch having SET and RESET input nodes and an output node. The SET input node is connected to the OR logic block so that the output node switches into a first logic state from a second logic state responsive to the combined logic signal on the SET input node. The circuit also has a delay unit connected to the OR logic block and to the RESET input node of the latch which precisely delays the combined logic signal to the RESET input node so that the output node of the latch switches back to the second logic state. A pulse is thus generated at the output node responsive to logic signal transitions at the input terminals. The pulse has a width controlled by the delay unit.

20 Claims, 4 Drawing Sheets

TRANSITION DETECTION CIRCUIT

BACKGROUND OF THE INVENTION

The present invention is related to digital logic circuits and, in particular, to MOS input transition detector circuits.

Input transition, sometimes called address transition, detectors have been widely used in integrated circuits. These detectors generate a pulse upon the transition of a signal at an input terminal of the circuit. There are various versions of such circuits but functionally the circuit is simply a circuit, as shown in FIG. 1, which has an EXCLUSIVE OR logic gate and a delay block. An EXCLUSIVE OR gate by definition generates a logic "1" signal when there is one and only one logic "1" signal at one of its input terminals. Stated differently, a logic 1 occurs when the two input signals are different. Thus, the circuit in FIG. 1 generates a logic 1 at its output when there is a transition at the input terminal from either logic 1 to logic 0, or logic 0 to logic 1. At this point the two input terminals to the EXCLUSIVE OR gate are different. The delay block puts in a time delay $\tau$ after which input terminals of the EXCLUSIVE OR gate have the same input states and causes the output terminal to return to a 0 state. Hence a pulse is generated.

The problem with this type of circuit is that there is difficulty in controlling the delay pulse width. Due to variations in the manufacturing process and operating conditions, the delay pulse width may vary widely. In many applications, such variations in a delay pulse width are tolerable. But in other cases the pulse width must be controlled.

The present invention provides for a circuit which detects input transitions at a plurality of input terminals and generates a single pulse which has a time delay which may be controlled with precision. Only a small number of transistors and other integrated circuit device elements are used to implement the circuit to achieve the benefits of a savings in valuable integrated circuit space. Furthermore, with the circuit according to the present invention, the generated pulse may be distributed in a network throughout the integrated circuit.

SUMMARY OF THE INVENTION

The present invention provides for a circuit for detecting the transition of the state of logic signals at a plurality of input terminals. The circuit has a transition detecting block connected to each input terminal which generates a pulse at the transition of a logic signal at the input terminal, an OR logic block connected to each transition detecting block for generating a combined logic signal from the transition detecting blocks, and a latch having SET and RESET input nodes and an output node. The SET input node is connected to the OR logic block so that the output node switches into a first logic state from a second logic state responsive to the combined logic signal on the SET input node. The circuit also has a delay unit connected to the OR logic block and to the RESET input node of the latch which precisely delays the combined logic signal to the RESET input node so that the output node of the latch switches back to the second logic state. A pulse is thus generated at the output node responsive to logic signal transitions at the input terminals. The pulse has a width controlled by the delay unit.

The present invention also provides for novel circuits in the pulse detecting blocks and the delay units.

DETAILED DESCRIPTION OF THE PREFERRED EMBODIMENTS

Figure 1:
FIG. 1 is a generalized input transition detector found in the prior art.
Figure 2:
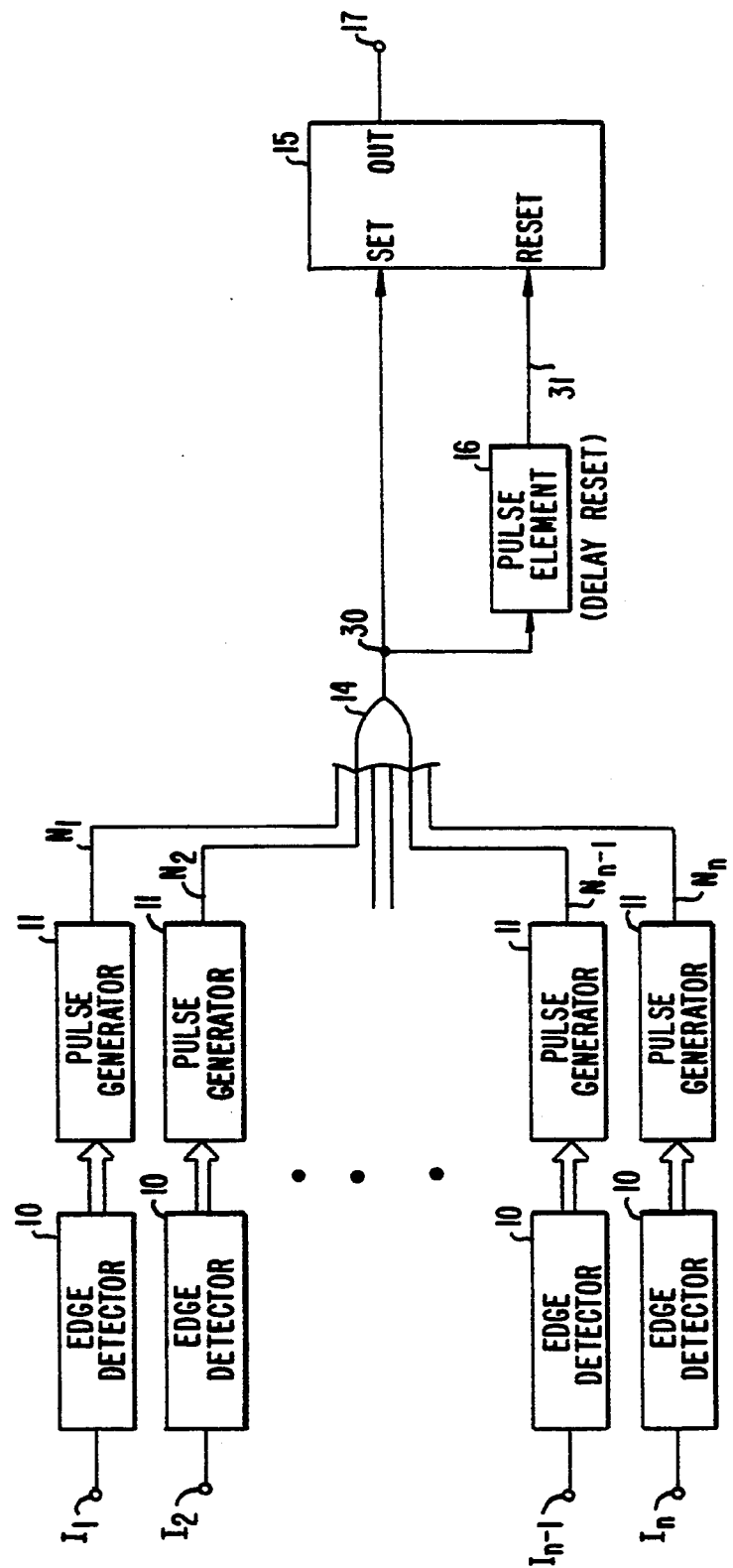
FIG. 2 is a block diagram of an embodiment of the present invention.

FIG. 2 illustrates the basic circuit blocks of an embodiment of the present invention. The circuit shown in FIG. 2 has a plurality of input terminals, each of which has an input signal respectively designated as $I_1-I_n$. Each terminal is connected to a edge detector block 10, each of which is connected to a pulse generator block 11. The signals at the output nodes of these blocks 11 are designated as $N_1$ to $N_n$, which nodes are connected to an OR logic block 14. The logic block 14 has an output node connected directly to the set input node of a set/reset latch block 15, which has an output terminal 17. The output node of the OR logic block 14 is also connected to an input node of a pulse element block 16 by a connecting node 30. The pulse element block 16 has an output node 31 which is connected to the reset input node of the latch 15.

Operationally, an edge detector block 10 detects the transition of an input signal, $I_1$ to $I_n$. Responsive to this detection, a pulse generator block 11 connected to the block 10 generates a pulse. The plurality of pulses from different blocks 11 are combined by the OR logic block 14 to issue a SET and a RESET signal to the latch block 15. The pulse element block 16 delays the RESET signal by a precise amount so that the pulse width issuing from the block 15 is set. Due to the operation of the logic block 14, transitions at one or more input terminals generate an output pulse.

Figure 3:
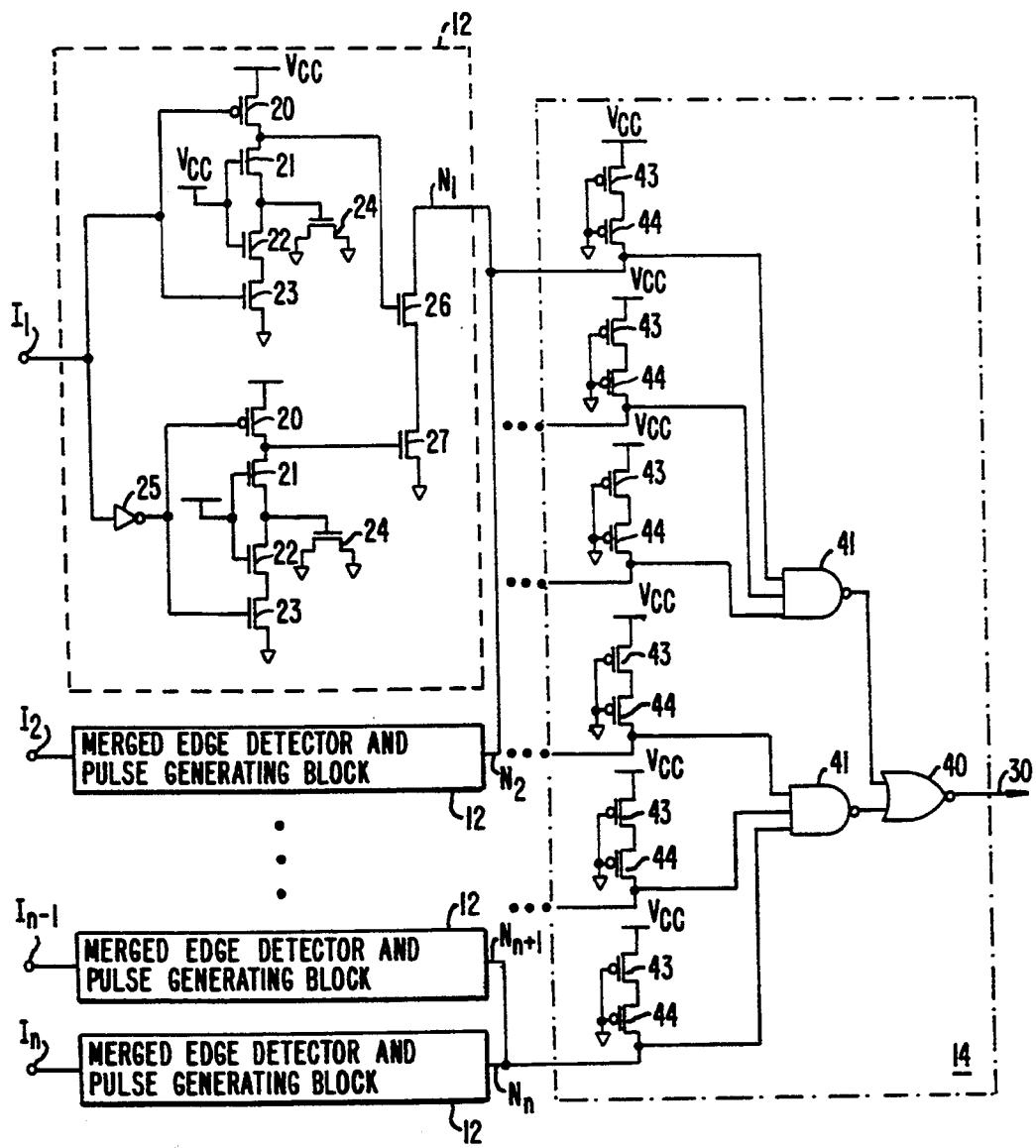
FIG. 3 is a detailed circuit diagram of the edge detector and pulse generator block and the OR gate block of the block diagram of FIG. 2.

FIG. 3 shows a detailed circuit schematic of a merged edge detector and pulse generating block 12 which combines the functions of the blocks 10 and 11 shown in FIG. 2. Each block 12 has an input terminal, shown with the input signal $I_1$, connected to two parallel circuit branches. One circuit branch is connected to the gates of a pair of switching transistors, PMOS transistor 20 and NMOS transistor 23. The source of the PMOS transistor 20 is connected to a voltage supply, $V_{CC}$, positive with respect to the second voltage supply, typically at ground. The drain of the transistor 20 is connected through the drain of a NMOS transistor 21 which has its source connected to a NMOS transistor 22. The source of the transistor 22 is connected to the drain of the second switching transistor 23. The gates of the transistors 21 and 22 are connected to the positive voltage supply to keep the transistors maintained in a resistive ON state. The source of the transistor 21 and the drain of the transistor 22 are connected in common to the gate of an NMOS transistor 24 which is connected in a capacitor configuration. Both source and drain of the NMOS transistor 24 are connected to ground. The drain of the PMOS switching transistor 20 and drain of the NMOS transistor 21 are connected in common to the gate of an NMOS transistor 26.

Likewise, the second branch circuit has an identical configuration so that the similarly functioning transistors have the same reference numerals. In addition, the second branch circuit has an inverter 25 between the input terminal of the block 12 and the commonly connected gates of the switching transistors 20 and 23 so that the second circuit branch operates in complementary fashion to the first circuit branch. Furthermore, the drain of the PMOS transistor 20 and the drain of the NMOS transistor 21 are connected in common to the gate of a NMOS transistor 27.

The NMOS transistors 26 and 27 form serially connected switches operated by two parallel circuit branches. The source of the NMOS transistor 27 is connected to ground and its drain connected to the source of the NMOS transistor 26 which has its drain forming the output node of the block 12.

The OR logic gate block 14 has a plurality of input nodes, each of which has PMOS transistors 43 and 44 acting as pull-up transistors. The source of the PMOS transistor 43 is connected to the power supply at $V_{CC}$ and its drain is connected to the source of the PMOS transistor 44 which in turn has its drain connected to an input node of the OR logic block 14. The gates of the transistors 43 and 44 are connected to ground so that they are maintained on to weakly pull the input nodes to a high logic state. This is true until the NMOS transistors 26 and 27 are turned on to pull the input node low.

Each input node is connected to a pair of blocks 12 in a wired OR configuration. Each input node is connected to the input node of a NAND logic block 41 which has its input connected to an input node of NOR logic gate 40. The output node of the NOR logic gate 40 forms the output node 30 of the NOR logic block 14. In the configuration illustrated in FIG. 3, each NAND gate 41 receives 3 input nodes and the NOR logic gate 40 has 2 input nodes. These numbers may be modified as circumstances dictate.

Together with the pullup action of the PMOS transistors 43 and 44 at each input node of the OR logic block 14, the block 12 generates a negative pulse at the transition of the input signal $I_1$ to $I_n$. Each output node signal $N_1-N_n$ from each block 12 is only pulled low when both NMOS transistors 26 and 27 are turned on. Each NMOS transistor 26 and 27 is connected to one of the circuit branches in the block 12. Due to the inverter 25, each pair of switching transistors 20 and 23 in the two circuit branches should be in opposing states. However, when the input signal switches state, the PMOS transistor 20 in one circuit branch is turned on. The PMOS transistor 20 in the other circuit branch is turned off and its NMOS transistor 23 turned on. However, the node connected to the gate of the NMOS transistor 26 or 27 must be discharged. This is performed through the resistive NMOS transistors 21 and 22. As is well-known to integrated circuit designers, there are many parameters of a transistor to adjust to select the desired resistance. For example, the transistors 21 and 22 may be reduced in size to increase resistance.

The charge on the capacitor-forming transistor 24 must also be discharged. Thus, the discharge is slowed so that the two NMOS transistors 26 and 27 are on to pull the output node low. When the discharge is completed, then output node signal $N_1-N_n$ is pulled high again. A negative pulse has been generated.

This pulse is generated whenever there is a transition in the input signal. Furthermore, the pulse width is determined by $\tau 1$, an RC time constant. R is substantially the resistance of the two transistors 21 and 22, and C the capacitance of the transistor 24. It should be noted that this block 12 is itself an input transition detector circuit. Compared to previous ITD circuits of comparable performance, however, the block 12 occupies a small amount of space, an advantage in integrated circuit design. Moreover, it also has a performance advantage over previous ITD circuits.

Figure 4:
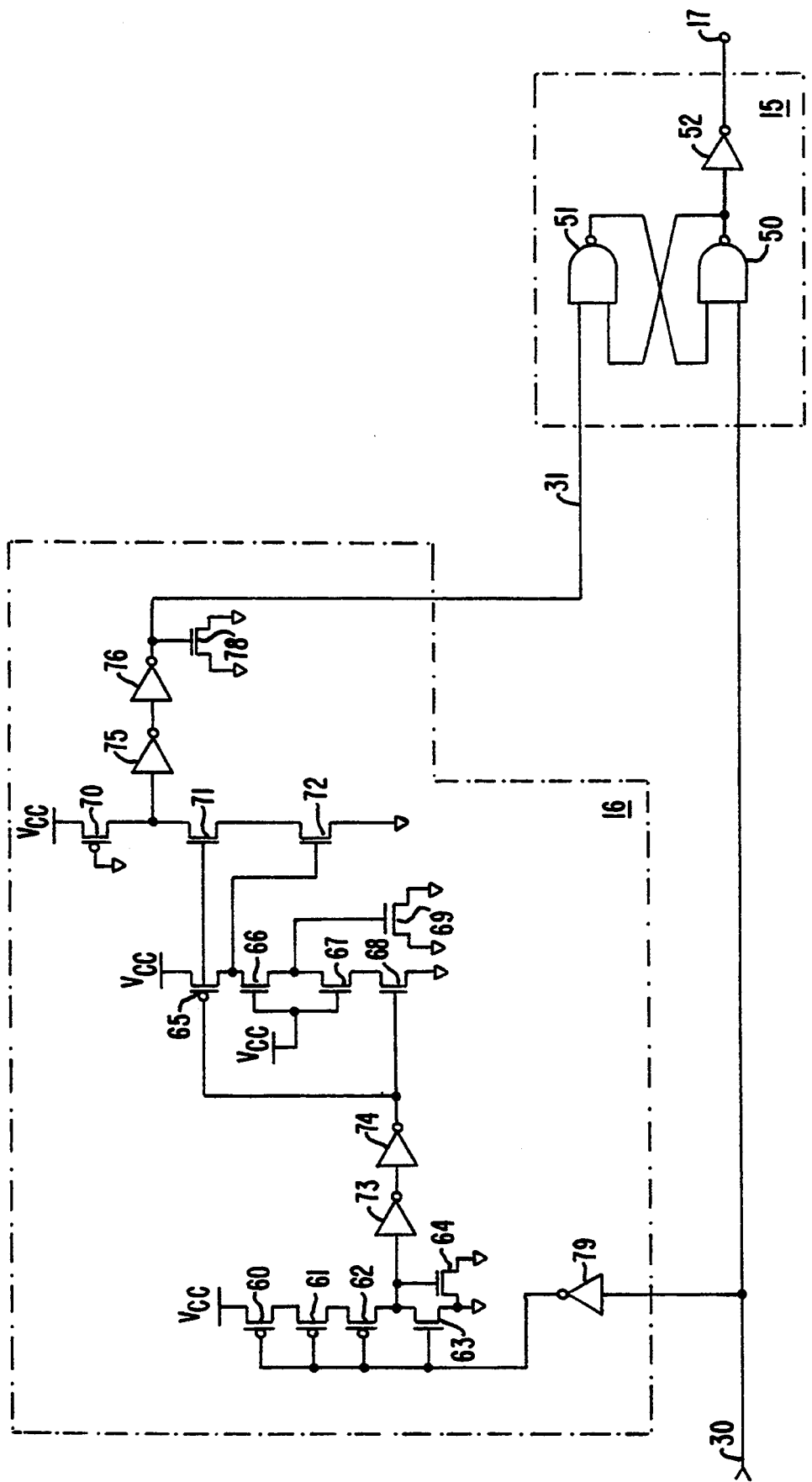
FIG. 4 is a circuit diagram of the pulse delay element block and the RS latch block of the diagram of FIG. 2.

As shown in FIG. 4, the output node 30 of the OR logic gate block 14 is connected to the set/reset latch block 15. The block 15 is formed by a typical cross-coupled pair of NAND gates 50 and 51. An input node of the NAND gate 50 receives the output node 30. The NAND gate 51 is connected to the output node of the pulse delay element 16, which has its input node connected to the output node 30 by an inverter 79.

The output node of the inverter 79 is connected to the gates of transistors 60–63 serially connected between $V_{CC}$ and ground. PMOS transistor 60 has its source connected to $V_{CC}$ and its drain connected to the source of the PMOS transistor 61. The drain of the PMOS transistor 61 is connected to the source of the PMOS transistor 62 which has its drain connected to the drain of the NMOS transistor 63. The source of the NMOS transistor 63 is connected to ground. The drain of the NMOS transistor 63 and drain of PMOS transistor 62 are connected in common to a gate of a NMOS transistor 64. The transistor 64 is connected in a capacitor configuration and has its source and drain of the transistor 64 are connected to ground. The drains of the transistors 63 and 62 are connected to the first of a serially connected pair of inverters 73 and 74.

The output node of the inverter 74 is connected to an input terminal of another novel ITD circuit and a variation of the circuit in block 12. The input terminal is formed by the gates of a pair of switching transistors 65 and 68. The source of the PMOS transistor 65 is connected to $V_{CC}$ and its drain to the drain of an NMOS transistor 66. The source of the transistor 66 is connected to the drain of an NMOS transistor 67. The source of the transistor 67 is connected to the drain of the NMOS switching transistor 68 which has its source connected to ground. Both gates of the transistors 66 and 67 are connected to $V_{CC}$ so that the transistors are maintained on in a resistive state. The sources of the transistor 66 and the transistor 67 are connected in common to the gate of a capacitor-configured NMOS transistor 69, which has both source and drain connected to ground.

Serially connected NMOS transistor 71 and 72 respectively have a gate connected to the gate of the PMOS transistor 68 and a gate connected to the drains of the transistors 68 and 66. The source of the NMOS transistor 72 is connected to ground and its drain connected to the source of the NMOS transistor 71. The drain of the NMOS transistor 71 is connected to the drain of a weak pull-up PMOS transistor 70, which has its source connected to $V_{CC}$ and its gate to ground so that the transistor is maintained ON.

Forming the output terminal of the circuit variation, the drain of the NMOS transistor 71 (and drain of PMOS transistor 70) is connected to series-connected inverters 75 and 76. The output node of the second inverter 76 forms the output node 31 of the pulse delay element 16. The output node is connected to the gate of a NMOS transistor 78 connected in capacitor configuration with both source and drains connected to ground.

In operation, a negative pulse from the OR logic block 14 through the output node 30 sets the latch block 15. The RESET signal arrives from the pulse delay element 16, which operates by first inverting the negative pulse from the output node 30 through the inverter 79. The now positive pulse turns on the PMOS transistors 60–62 and turns off the NMOS transistor 63. Due to the resistance of these serially-connected transistors 60–62, which are sized appropriately for resistance purposes, and the capacitance of the transistor 64, this input node to the inverter 73 slowly rises. At a predetermined point the inverter 73 changes state.

The second inverter 74, as an inverting buffer, drains the positive signal to turn off the switching PMOS transistor 65 and turn on the switching NMOS transistor 68. The drains of the PMOS transistor 65 and NMOS transistor 66 are pulled to ground along with the source of the transistor 66 and drain of the transistor 67. Due to the RC action of the resistive transistors 66 and 67 and the capacitor-connected transistor 69, there is a delay in the discharge of the node connected to the gate of the NMOS transistor 72.

This delay causes a pulse to be generated by the action of the two switching NMOS transistors 71 and 72. By the pull-up action of the PMOS transistor 70, the drain of the transistor 70 and drain of the transistor 71 is typically high. With the delay in pulling the gate of the transistor 72 low, both transistors 71 and 72 are on. The input node of the inverter 75 is low until the gate of the transistor 72 is pulled low to turn off the transistor 22.

The negative pulse is propagated through the two inverters 75 and 76 and slowed by the capacitor-connected transistor 78. The negative pulse finally appears on the reset node 31 to return the set/reset latch 15 to its original state. A pulse is generated at the output terminal of the latch 15.

The difference in arrival of the two negative signals on the set and reset input nodes determines the pulse width of the latch 15. The single pulse delay element 16 controls the difference with precision. The output signal generated from the output terminal 17 from the latch 15 can be used to drive a network of signal paths on an integrated circuit. The pulse width is precise and the signal, being driven from a latch, is certain.

Figure 5:
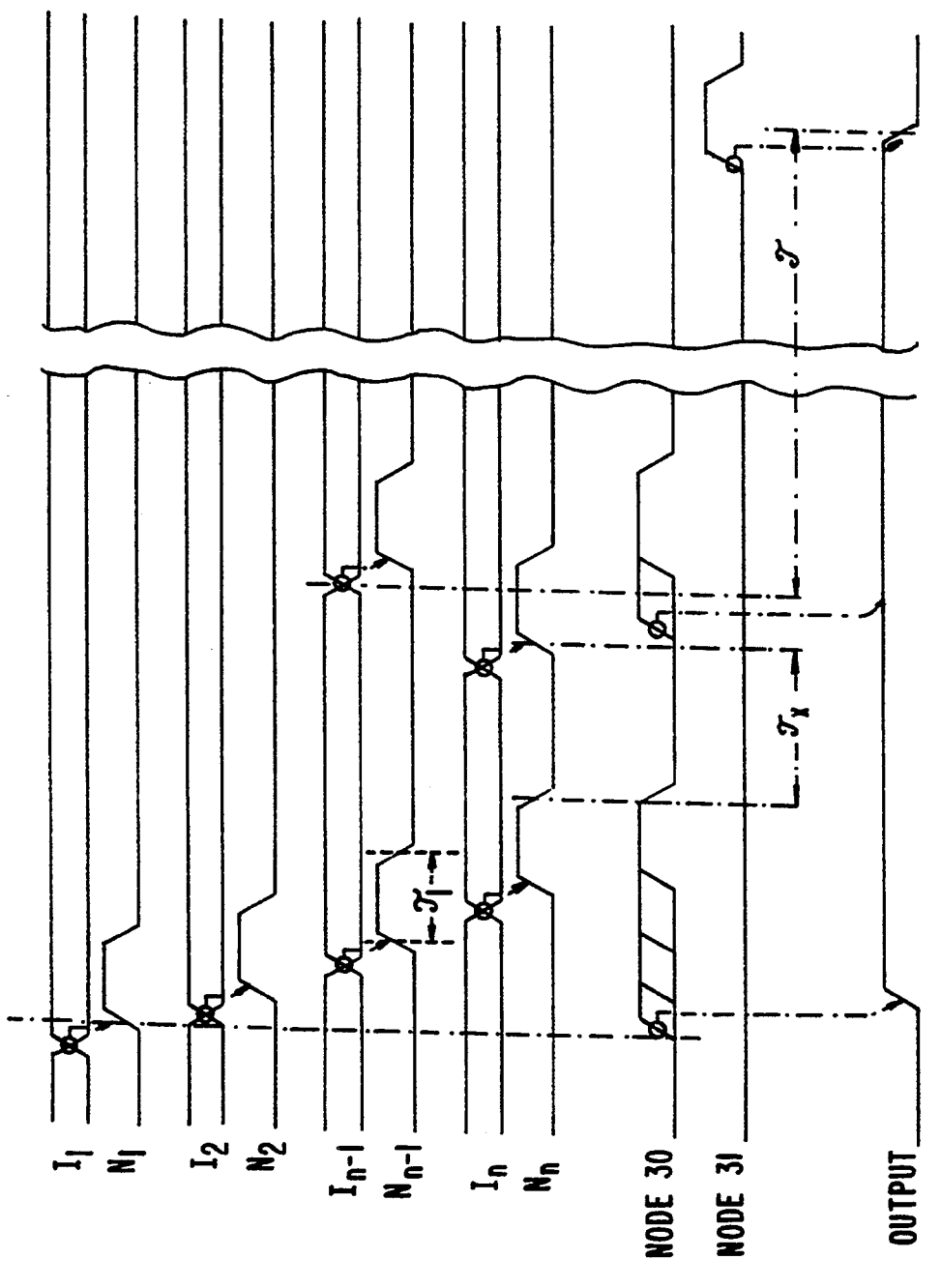
FIG. 5 is a timing diagram of the signals at various nodes and terminals of the circuit illustrated in FIGS. 2-4.

FIG. 5 helps illustrate the operation of the present invention. At the transition at any one of the input signals, $I_1-I_n$, a pulse of width $\tau 1$ is generated as follows. For example, assuming initially that the signal $I_1$ is at logic 1, then the PMOS switching transistor 20 in the upper branch is OFF and the NMOS transistor 23 is ON. Thus, the voltage on the gate terminal transistor 26 low and the transistor is OFF. Time $\tau_x$ represents the time between pulses at output node signal $N_n$. The Output pulse is triggered by the initial pulse on node 30 and continues for a precise amount of time $\tau$ after the last transition of the input signal occurs ($I_{n-1}$ in FIG. 5). After time $\tau$, the pulse at node 31 causes the latch block 15 to reset. Thus, the Output pulse is a precise pulse that continues until time $\tau$ after the last input transition.

While the above is a complete description of the preferred embodiments of the invention, various alternatives, modifications and equivalents may be used. It should be evident that the present invention is equally applicable by making appropriate modifications to the embodiments described above. Therefore, the above description should not be taken as limiting the scope of the invention which is defined by the metes and bounds of the appended claims.

What is claimed is:

1. A circuit for detecting the transition of the state of logic signals at a plurality of input terminals, said circuit comprising means connected to each input terminal of said plurality of input terminals for generating a pulse at the transition of a logic signal at said input terminal;

means connected to said pulse generating means for generating a-combined logic signal from said pulse generating means pulses;

a bistable logic Unit having first and second input nodes and an output node, said first input node connected to said combined logic signal generating means, said output node switching into a first logic state from a second logic state responsive to said combined logic signal on said first input node; and a delay unit connected to said combined logic signal generating means and to said second input node of said bistable logic unit for delaying said combined logic signal to said second input node, said output node of said bistable logic unit switching back to said second logic state responsive to said combined logic signal on said second input node;

whereby a pulse is generated at said output node responsive to a logic signal transitions at said plurality of input terminals, said pulse having a width controlled by said delay unit.

2. The transition detecting circuit of claim 1 wherein said bistable logic unit comprises a set-reset latch.

3. The transition detecting circuit of claim 1 wherein said pulse generating means comprises a output node weakly coupled to a first of two power supplies;

a first circuit branch connected to an input terminal, said first circuit branch having a first branch output node, said first branch output node being coupled to said first power supply responsive to a first logic state of a signal on said input terminal and to a second power supply responsive to a second logic state of said signal on said input terminal;

a second circuit branch connected to said input terminal, said second circuit branch having a second branch output node, said second branch output node being coupled to said second power supply responsive to said first logic state of said signal on said input terminal and to said first power supply responsive to a second logic state of said signal on said input terminal, one of said first and second branch output nodes being coupled to its respective power supply more slowly by a predetermined amount than the other of said first and second branch output nodes responsive to a transition to said first logic state at said input terminal;

first and second MOS transistors, each having a gate, said transistors connected in series between said output node and said second power supply, a gate of said first MOS transistor connected to said first branch output node, a gate of said second MOS transistor connected to said second branch output node, said first and second MOS transistors being simultaneously turned on at a transition to said first logic state at said input terminal;

whereby said output node is pulled toward said second power supply temporarily at said transition to generate a pulse.

4. The transition detecting circuit of claim 3 wherein each circuit branch comprises a pair of switching transistors connected in a serial path with resistance and capacitor elements between said first and second power supplies, each of said switching transistors having a gate connected to said input terminal, said branch output node connected to said serial path.

5. The transition detecting circuit of claim 4 wherein said pair of switching transistors comprises a PMOS transistor having a source connected to said first power supply and a NMOS transistor having a source connected to said second power supply.

6. The transition detecting circuit of claim 4 wherein said resistance element comprise at least one MOS transistor having a source and drain connected in said serial path and a gate connected to a voltage source such that said one MOS transistor is turned on.

7. The transition detecting circuit of claim 4 wherein said capacitance element comprises at least one MOS transistor having a source and drain connected to one of said power supplies and a gate connected to said serial path.

8. The transition detecting circuit of claim 1 wherein said delay unit comprises
a first switching subcircuit, said subcircuit having an input node and an output node, a plurality of switching transistors each having a gate connected to said input node, said switching transistors connected in a serial path with a capacitance element between first and second power supplies, a first switching transistor having a source connected to said first power supply and a drain connected to said output node, at least one of said remaining switching transistors being highly resistive when complementarily turned on relative to said first switching transistor so that said output node is coupled to said second power supply with a RC time constant.

9. The transition detecting circuit of claim 8 wherein all of said remaining switching transistors being highly resistive when complementarily turned on relative to said first switching transistor.

10. The transition detecting circuit of claim 9 wherein said first switching transistor comprises a NMOS transistor and said remaining switching transistors comprises PMOS transistors.

11. The transition detecting circuit of claim 1 wherein said delay unit comprises a switching subcircuit, said subcircuit having an input node and an output node, said subcircuit having
a first pair of complementary switching transistors, each switching transistor having a source connected to one of first and second power supplies respectively, and a drain connected to a drain of the other switching transistor in a serial path with resistance and capacitor elements, each switching transistors having a gate connected to said input node;
a second pair of switching transistors connected in a serial path with said output node and a coupling element between first and second power supplies, said coupling element weakly coupling said output node to said second power supply, one of said switching transistors having a gate connected to a gate of one said complementary switching transistors, the other of said switching transistors having a gate connected to said drain of said complementarily switching transistor;
whereby both of said second pair of switching transistors are simultaneously turned on at a transition to a first logic state at said input node so that said output node is connected toward said first power supply temporarily at said transition to generate a pulse.

12. The transition detecting circuit of claim 11 wherein said pair of complementarily switching transistors comprises a PMOS transistor having a source connected to said second power supply and a NMOS transistor having a source connected to said first power supply.

13. The transition detecting circuit of claim 12 wherein said resistance element comprises at least one MOS transistor having a source and drain connected in said serial path and a gate connected to a voltage source such that said one MOS transistor is turned on.

14. The transition detecting circuit of claim 12 wherein said capacitance element comprises at least one MOS transistor having a source and drain connected to one of said power supplies and a gate connected to said serial path.

15. The transition detecting circuit of claim 12 wherein said second pair of switching transistors comprise NMOS transistors.

16. A circuit for detecting a transition of a logic state of a signal at an input terminal, comprising
an output terminal weakly coupled to a first of two power supplies;
a first circuit branch connected to said input terminal, said first circuit branch having a first branch output node, said first branch output node being coupled to said first power supply responsive to a first logic state of a signal on said input terminal and to a second power supply responsive to a second logic state of said signal on said input terminal;
a second circuit branch connected to said input terminal, said second circuit branch having a second branch output node, said second branch output node being coupled to said second power supply responsive to said first logic state of said signal on said input terminal and to said first power supply responsive to a second logic state of said signal on said input terminal, one of said first and second branch output nodes being coupled to its respective power supply more slowly by a predetermined amount than the other of said first and second branch output nodes responsive to a transition to said first logic state at said input terminal;
each circuit branch comprises a pair of switching transistors connected in a serial path having resistance and capacitor elements between said first and second power supplies, each of said switching transistors having a gate connected to said input terminal, said branch output node connected to said serial path, and said capacitance element comprises at least one MOS transistor having a source and drain connected to one of said power supplies and a gate connected to said serial path;
first and second MOS transistors, each having a gate, said transistors connected in series between said output terminal and said second power supply, a gate of said first MOS transistor connected to said first branch output node, a gate of said second MOS transistor connected to said second branch output node, said first and second MOS transistors being simultaneously turned on at a transition to said first logic state at said input terminal;

whereby said output terminal is pulled toward said second power supply temporarily at said transition to generate a pulse.

17. A circuit for detecting a transition of a logic state of a signal at an input terminal, comprising an output terminal weakly coupled to a first of two power supplies;

a pair of switching transistors connected in a serial path having resistance and capacitor elements between said first and second power supplies, each of said switching transistors having a gate connected to said input terminal, an output node connected to said serial path being coupled to said second power supply responsive to said first logic state of said signal on said input terminal and to said first power supply responsive to a second logic state of said signal on said input terminal, said coupling of said output node to a power supply being slowed by a predetermined amount of said resistance and capacitor elements responsive to a transition to said first logic state at said input terminal;

first and second MOS transistors, each having a gate, said transistors connected in series between said output terminal and said second power supply, a gate of said first MOS transistor connected directly to said input terminal, a gate of said second MOS transistor connected to said output node, said first and second MOS transistors being simultaneously turned on at a transition to said first logic state at said input terminal;

whereby said output terminal is pulled toward said second power supply temporarily at said transition to generate a pulse.

18. The transition detecting circuit of claim 17 wherein said pair of switching transistors comprises a PMOS transistor having a source connected to said first power supply and a NMOS transistor having a source connected to said second power supply.

19. The transition detecting circuit of claim 17 wherein said resistance element comprises at least one MOS transistor having a source and drain connected in said serial path and a gate connected to a voltage source such that said one MOS transistor is turned on.

20. The transition detecting circuit of claim 17 wherein said capacitance element comprises at least one MOS transistor having a source and drain connected to one of said power supplies and a gate connected to said serial path.

* * * * *